United States Patent
Kawaguchi

(10) Patent No.: US 6,612,316 B2
(45) Date of Patent: Sep. 2, 2003

(54) WET PROCESSING DEVICE WITH SENSOR-CONTROLLED CONVEYOR

(75) Inventor: Hidehiko Kawaguchi, Tokyo (JP)

(73) Assignee: NEC Electronics Corporation, Kawasaki (JP)

(*) Notice: Subject to any disclaimer, the term of this patent is extended or adjusted under 35 U.S.C. 154(b) by 78 days.

(21) Appl. No.: 09/790,551

(22) Filed: Feb. 23, 2001

(65) Prior Publication Data

US 2001/0017148 A1 Aug. 30, 2001

(30) Foreign Application Priority Data

Feb. 25, 2000 (JP) ........................................ 2000-049135

(51) Int. Cl.[7] .................................................. B08B 3/08
(52) U.S. Cl. .................... 134/56 R; 134/95.1; 134/98.1; 134/113; 134/135; 134/902
(58) Field of Search ........................ 134/56 R, 57 R, 134/95.1, 98.1, 113, 135, 902

(56) References Cited

U.S. PATENT DOCUMENTS

| | | | | |
|---|---|---|---|---|
| 5,722,441 A | * | 3/1998 | Teramoto ..................... | 134/113 |
| 5,845,660 A | * | 12/1998 | Shindo et al. ........... | 134/102.3 |
| 5,950,645 A | * | 9/1999 | Olesen et al. ............ | 134/100.1 |
| 6,192,902 B1 | * | 2/2001 | Makita et al. .............. | 134/113 |
| 6,241,827 B1 | * | 6/2001 | Tanaka et al. ................ | 134/10 |

* cited by examiner

Primary Examiner—Randy Gulakowski
Assistant Examiner—Joseph Perrin
(74) Attorney, Agent, or Firm—McGinn & Gibb, PLLC

(57) ABSTRACT

A wet processing device of this invention is comprised of a chemical processing tank to store chemicals for processing the surface of the wafer, a wafer conveyor device to carry the wafer in and out of the interior of the chemical processing tank, and a sensor to determine the amount of air bubbles occurring within the chemical when present within the chemical processing tank and issue a first and a second control signal, and a wash tank to store water for washing the wafer carried out from the chemical processing tank by the wafer conveyor. The rising speed of the wafer conveyor device pulled the wafer up from the chemical processing tank is controlled in response to the first control signal, and the wash tank water fill quantity for supplying water to the wash tank is controlled in response to the second control signal.

3 Claims, 4 Drawing Sheets

PRIOR ART

WET PROCESSING DEVICE WITH SENSOR-CONTROLLED CONVEYOR

BACKGROUND OF THE INVENTION

1. Field of the Invention

This invention relates to a wet processing device and relates in particular to a wet processing device for washing with liquid, the wafer surface for forming into a semiconductor substrate.

2. Description of the Prior Art

In the prior art, washing of the wafer surface to form the semiconductor substrate for fabricating the semiconductor elements, utilized a wet processing device using a chemical such as sulfuric acid.

A cross sectional view of the chemical tank and a cross sectional view of the wash tank comprising the wet processing device for describing an example of the prior art are shown respectively in FIG. 5A and FIG. 5B. The wet processing device of the prior art, as shown in FIG. 5A and FIG. 5B is comprised of a chemical tank 1 consisting of an inner tank 1a filled with a chemical 5 such as sulfuric acid and an outer tank 1b formed on the periphery above the inner tank 1a, a wafer conveyor 8 for moving the wafer 2, and a wash tank 15 for washing the processed wafer 2.

As shown in FIG. 5A, when the inner tank 1a of the chemical tank 1 is filled with a chemical 5, a wafer stand 3 at the bottom is prepared, and a wafer 2 held by a conveyor chuck 9 of the wafer conveyor 8 are moved along the conveyor shaft 8a, and placed on the wafer stand 3. When loading of the wafer 2 is finished, the wafer conveyor 8 moving along with the conveyor shaft 8a, separates from the inner tank 1. The chemical tank 1 is also formed with an outer tank 1b on the upper part on the outer circumference and along with containing the chemical 5 such as sulfuric acid that overflowed from the inner tank 1a, also connects to a chemical line formed between the outer tank 1b and the inner tank 1a for circulating the chemical 15. A circulating pump 13 and a filter 14 are installed on this chemical line and fulfill the functions of circulating and filtering the chemical 5. In this way, when the surface processing of the wafer 2 is performed for a specified time inside the chemical tank 1, the dust particles that were attached to the wafer surface float free and are separated along with the air bubbles 4 within the chemical 5. When the processing within the chemical tank 1 is complete, the wafer conveyor 8 once again moves inside the chemical tank 1, holds the wafer 2 in the conveyor chuck 9 and extracts the wafer 2 from the chemical tank 1.

The wafer 2 extracted from the chemical tank 1 as shown in FIG. 5B is conveyed to the wash tank 15, and placed on the wafer stand 16 installed on the bottom of the wash tank 15 filled with distilled water. When placement of the wafer 2 is complete, the wafer conveyor 8 is pulled up to the outside, the same as in the case of the chemical tank 1. The wash tank 15 is connected to a water supply line 17 in the bottom, and an air-operated water supply valve 18 is installed in the water supply line 17. After supplying wash water for a specified time, the wafer 2 is once again pulled up on the wafer conveyor 8, and the wet processing is complete.

In other words, in the wet processing device of the prior art, a wafer 2 is conveyed to the chemical tank 1 by the wafer conveyor 8, and after a fixed amount of processing time, is lifted at a fixed speed from the chemical tank 1. The wafer 2 is then transported to the wash tank 15, the air-operated water supply valve 18 is opened, distilled water supplied from the water supply line 12 and washing performed.

The above described wet processing device of the prior art has the problems that the wafer can only be conveyed at the fixed pull-up speed set during the startup adjustment, and that the supply (filling) speed of the distilled water was also a fixed speed.

When for example the wafer was conveyed in a state with air bubbles in the chemical still remaining on the wafer surface, these residual air bubbles widened the surface area of the wafer so that dust particles in the air tended to easily adhere to the wafer surface. The device of the prior art therefore had the problem that many dust particles remained on the wafer after wet processing.

To avoid the problems caused by the effect of airborne particles and air bubbles, the pull-up speed of the wafer can be set to a high speed however at a fast pull-up speed, the quantity of chemical flowing into the wash tank becomes large, and the flow rate of distilled water into the wash tank must be set to a large amount. Therefore, in the wet processing device of the prior art, the pull-up speed had to be set to a fixed speed, and the supply of distilled water had to be fixed at large quantity.

Wafers however, have to actually be processed under various conditions. Some wafers tending to generate many air bubbles and some wafers tending to generate few bubbles are both present during the chemical processing. The wafers are also effected by the hydrogen peroxide concentration in the mixed solution of sulfuric acid and water.

Therefore, when a large quantity of water is constantly supplied in this way, to the wash tank while a mix of a large quantity of air bubbles and a small quantity of air bubbles are generated overall during the chemical processing, the prior art had the problem of an overly large cost for distilled water.

BRIEF SUMMARY OF THE INVENTION

Objects of the Invention

In view of the problems of the prior art, this invention has the object of providing a wet processing device capable of limiting the amount of distilled water usage in the chemical tank and wash tank, reducing the particle adherence to the wafer after wet processing caused by adherence of airborne dust and air bubbles remaining on the wafer surface after being raised from the chemical tank, handling various types of wafers, providing uniform wafer quality, and further improving the reliability of the product to a higher level.

SUMMARY OF THE INVENTION

To achieve the above objects, the wet processing device of this invention is comprised of a chemical processing tank to store chemicals for processing the surface of the wafer, a wafer conveyor to carry the wafer in and out of the interior of the chemical processing tank, a sensor to determine the amount of air bubbles occurring within the chemical when present within the chemical processing tank and issue a first and a second control signal, and a wash tank to store water for washing the wafer carried out from the chemical processing tank by the wafer conveyor. The rising speed of the wafer conveyor device pulling the wafer up from the chemical processing tank is controlled in response to the first control signal, and the wash tank water fill quantity for supplying water to the wash tank is controlled in response to the second control signal.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1A:
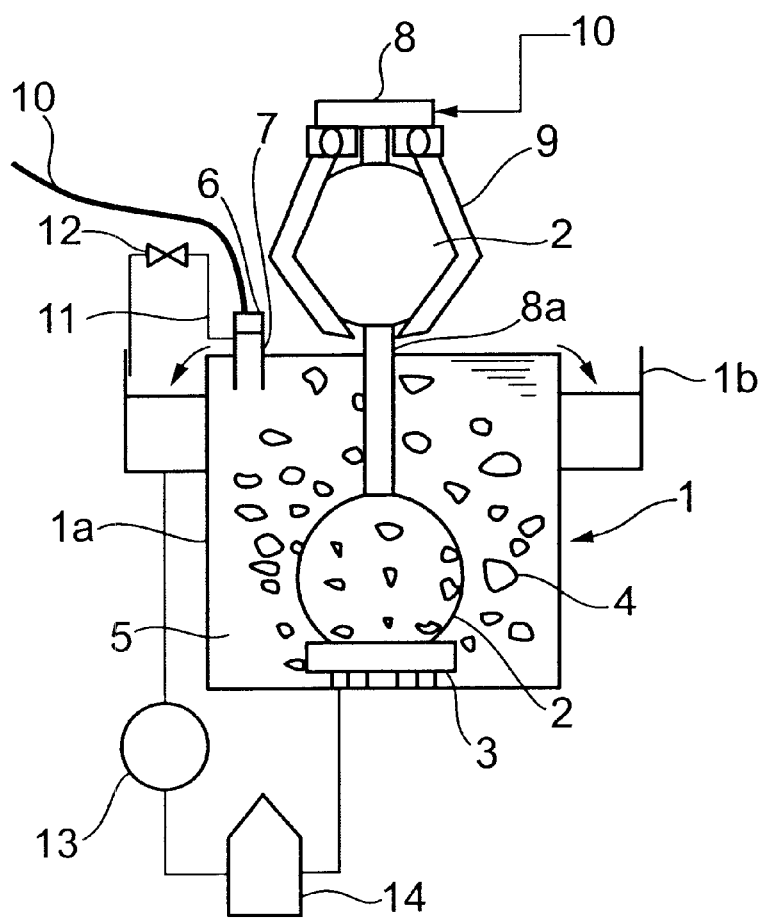
FIG. 1A and FIG. 1B are respectively drawings showing cross sectional views of the wet processing device of the first embodiment of the invention.
Figure 1B:
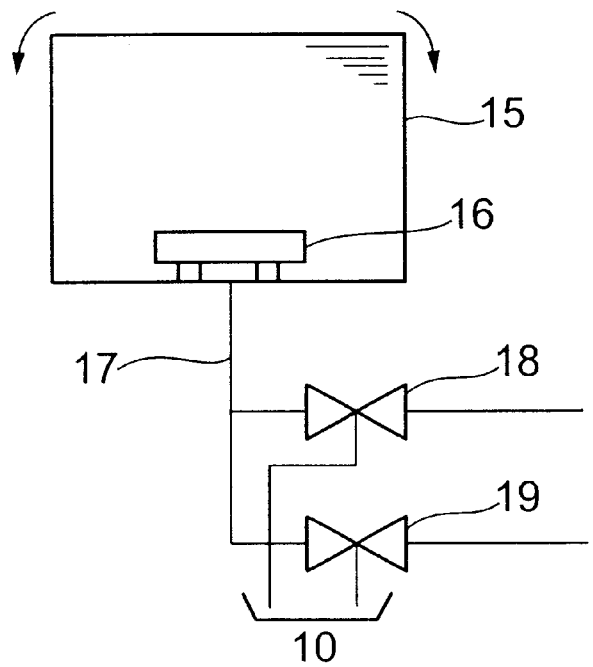

A detailed description of the embodiments of this invention is next related while referring to the accompanying drawings. FIG. 1A and FIG. 1B are respectively drawings showing cross sectional views of the chemical tank and the wash tank comprising the wet processing device of the first embodiment of the invention. This embodiment, as shown in FIG. 1A and FIG. 1B is comprised of a chemical tank 1 consisting of an inner tank 1a and an outer tank 1b, a wash tank 15, and a wafer conveyor 8.

As shown in FIG. 1A, the inner tank 1a of the chemical tank 1, besides having a wafer stand 3 for mounting the wafer 2 conveyed to the bottom, also has a cylinder 7 in the vicinity of the upper edge for overflow of the chemical 5. The cylinder 7 uses a material having excellent chemical resistance, is affixed with a non-contact fluid level sensor 6 at the top connected by a wire 10, and is open at the bottom. The non-contact fluid level sensor 6 detects the level of air bubbles 4 emitted in the inner tank 1a, and supplies different types of control signals by way of the wire 10. The cylinder 7 is connected with an air bleed pipe 11 to bleed off (remove) the air bubbles 4 accumulated in the sealed space formed in the lower part of the sensor 6, and the passage in the pipe 11 is installed with an air solenoid operated valve (ASV) 12. The wafer conveyor 8 conveys the wafer 2 held in the conveyor chuck 9 along the shaft 8a to the wafer stand 3 installed in the inner tank 1a of the chemical tank 1. However the wafer pull-up speed when extracting the wafer from the tank, is a high pull-up speed or a low pull-up speed based on the output from the sensor 6. A circulating pump 13 and a filter 14 are installed in the chemical line between the inner tank 1a and the outer tank 1b, the same as in the example of the prior art.

Next, as shown in FIG. 1B, the wafer 2 extracted by the wafer conveyor 8 from the inner tank 1a of the chemical tank 1 is conveyed to the wash tank 15 and mounted on the wafer stand 16 installed in the bottom. The wash tank 15 connects to the water supply line 17 and carries out washing of the wafer 2. In the example of the prior art, one water-supply air operated valve is connected to the water supply line 17, and a fixed quantity (fixed speed) of distilled water was supplied to the wash tank 15. Here however, a first water-supply air operated valve 18 for high-speed water supply, and a second water-supply air operated valve 19 for low-speed water supply are installed. The selection of these first and second water-supply air operated valves 18, 19 is performed by control signals from the above mentioned non-contact fluid level sensor 6. When many air bubbles 4 are detected, high speed is selected or in other words, the first water-supply air operated valve 18 is opened to supply a large quantity of distilled water. Conversely, when few air bubbles 4 are detected, the low speed is selected or in other words, the second water-supply air operated valve 19 is opened to supply a small quantity of distilled water.

Figure 2:
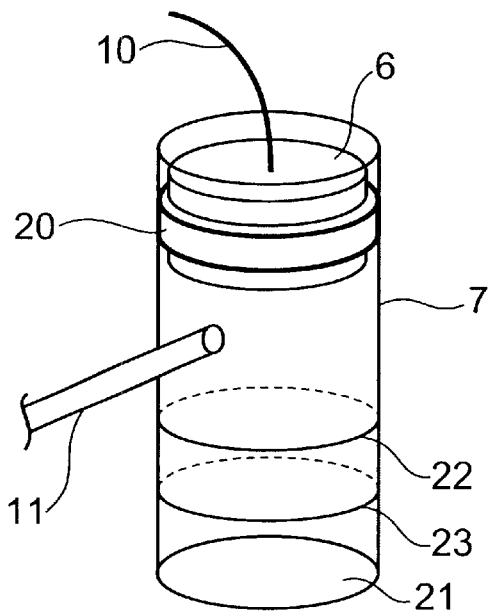
FIG. 2 is an enlarged view of the sensor and cylinder of FIG. 1A.

An enlarged view of the sensor and cylinder of FIG. 1 is shown in FIG. 2. The non-contact fluid level sensor 6 is inserted in the top section of the cylinder 7 as shown in FIG. 2. A sealing material 20 is installed between the non-contact fluid level sensor 6 and the cylinder 7 to prevent drooping and to maintain the air sealing. An air bleed pipe 11 is installed between the overflow level constituted by the bottom of the non-contact fluid level sensor 6 and the reference fluid level 22, on the side of the cylinder 7, and the above described ASV (air solenoid operated valve) ASV 12 is installed in this pipe 11. An opening 21 is formed in the bottom of the cylinder 7, and along with the open surface of the opening 21 and the overflow surface forming a right angle versus the cylinder 7 axis, the cylinder 7 itself is installed in an inner tank position not exerting an effect in the event of an overflow of chemical 5 to the outer tank 1b or in other words installed near the inner side of the wall of the inner tank 1a. Consequently, when installed in the inner tank 1a of the cylinder 7, and the valve 12 installed in the pipe 11 is opened, or in other words when the air is bled off, the reference fluid level 22 can match the overflow. A fluid setting level 23 can also be set to the desired level between the reference fluid level 22 and the opening 21.

Therefore, after installing the cylinder 7 and bleeding off the air, the fluid level within the cylinder drops from reference fluid level 22 to the desired fluid setting level 23 due to the penetration of some air bubbles through the opening 21. When the fluid level inside the cylinder falls to the fluid setting level 23 due to the air bubbles, the sensor 6 detects the presence of many air bubbles, and implements control by way of the wire 10.

Figure 3:
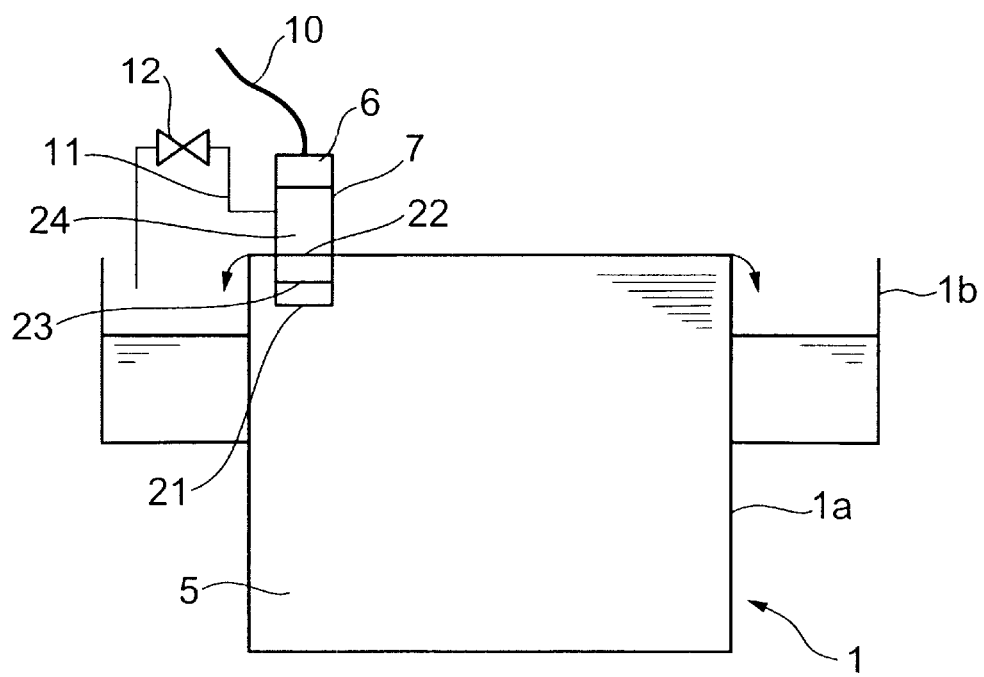
FIG. 3 is an enlarged view of the chemical tank and cylinder of FIG. 1A.

FIG. 3 shows an enlarged view of the chemical tank and cylinder of FIG. 1. The non-contact fluid level sensor 6 in the cylinder 7 installed in the inner tank 1a of the chemical tank 1, as shown in FIG. 3 has already determined the level formed by the opening 21 of cylinder 7 and the reference fluid level 22 so that no fluid level detection is required. Just detecting the optional level that the fluid setting level 23 is set to is sufficient. The optionally set fluid setting level 23 in the cylinder 7 can be just one level for checking the air bubble quantity and switching to high speed/low speed or can be two levels for switching to high speed/low speed. In either case, just providing a function for detecting the fluid level with the sensor 6 is sufficient.

The non-contact fluid level sensor 6 determines that the amount of air bubbles is large when the fluid level reaches fluid setting level 23 and commands the shaft drive of wafer conveyor 8 to perform high-speed wafer pull-up. On the other hand, if the optional level that the fluid setting level 23 is set to is not detected, then the sensor 6 commands the shaft drive of wafer conveyor 8 to perform low-speed wafer pull-up.

The non-contact fluid level sensor 6 controls the water quantity of the wash tank 15 in the same way, by detecting the air bubbles. In other words, when determined that a large amount of air bubbles are present, a thick deposit of chemical remains on the wafer surface in order to set a high speed pull-up of the wafer as described above. The remaining chemical must be washed (rinsed) requiring a large distilled water flow rate so the water supply line must be switched to a flow rate to handle a large water quantity. Conversely, when few air bubbles are found, a low pull-up speed is set and the flow rate is small.

In detecting the air bubbles 4 of the chemical tank 1 in this embodiment in this way, the amount of air bubbles 4 are detected as the height of the fluid setting level 23 in the sealed space 24 inside the cylinder 7. In other words, when the fluid level formed in the sealed space 24 has dropped to the optional level set for the fluid setting level 23, many air bubbles are determined to be present, and a command for high speed pull-up of the wafer 2 from the chemical tank 1 is sent. Also, when determined that many air bubbles 4 are present, a large flow rate is specified for the water supply line at the wash tank 15.

The embodiments of the invention are hereafter described in more detail while referring to FIG. 1 through FIG. 3.

Under the conditions of chemical processing that generates many air bubbles and a minute amount of air-borne particles around the chemical tank 1 and the wash tank 15, air-borne particles are easily prone to adhere to the surface of the wafer 2 being conveyed to the wash tank 15 after chemical processing. Furthermore, even more bubbles are generated due to reaction with sulfuric acid and hydrogen peroxide when processing a wafer 2 with a resist coating, in sulfuric acid and hydrogen peroxide so that the adherence of particles to the surface of the wafer being conveyed is even further accelerated. Here, an example of sulfuric acid—hydrogen peroxide processing followed by washing is described for the case where air bubbles are easily prone to occur due to effects of the circulating line and chemicals, under conditions of a minute amount of air-borne particles present while conveying a mix of both resist and non-resist coated wafers. The fluid setting level 23 was made to match the level of opening 21.

First of all, prior to mounting the wafer 2 in the wafer conveyor 8 in the chemical tank 1, the ASV 12 is opened and the air inside the cylinder 7 is bled off. When the air inside this cylinder 7 is bled off (removed), the space inside the cylinder is open to the outer air so that the reference fluid level 22 inside the cylinder 7 is at the same height as the overflow level. This non-contact fluid level sensor 6 detects the fluid level 22 inside the cylinder 7, and closes the ASV 12 after confirming that the overflow level of inner tank 1a of chemical tank 1 matches the reference fluid level 22 within the cylinder 7, and stops the cylinder 7 air bleeding. Closing this ASV 12 forms a sealed space 24 between the fluid level 22 of cylinder 7 and the bottom edge of the non-contact fluid level sensor 6.

Then, when the non-contact fluid level sensor 6 detects the fluid level 22 inside the cylinder 7, the wafer 2 is conveyed to the inner tank 4 of chemical tank 1, and chemical processing starts. Further, circulation filtering is performed in the chemical tank 1, and overflow of chemical 5 occurs from the inner tank 1a to the outer tank 1b, and the air bubbles 4 in the chemical 5 also overflow. During the overflow, a portion of the air bubble 4 in the chemical 5 pass through the opening 21 formed in the bottom of the cylinder 7 and are trapped in the sealed space 21. When the wafer 2 is resist wafer, air bubbles are generated by the reaction with the sulfuric acid and hydrogen peroxide so that a portion of these air bubbles are also trapped in the same way in the cylinder 7.

When the air bubbles 4 are trapped inside the cylinder 7, the chemical inside the cylinder 7 is ejected from the opening 21 of cylinder 7, and the sealed space 24 expands. In other words, the fluid level inside the cylinder 7 drops from the fluid level 22, and the non-contact fluid level sensor 6 does not detect the fluid level 22.

The fluid level inside the cylinder 7 declines even further, and when the non-contact fluid level sensor 6 detects the fluid setting level 23 set at the level at the opening 21 during chemical processing, the wet processing is determined to have many air bubbles 4. A first control signal to set the pull-up speed of the wafer 2 after chemical processing to high speed is therefore sent to the shaft drive of the wafer conveyor 8 by way of the wire 10. A second control signal sent simultaneously from the sensor 6, opens the first water-supply air operated valve 18 during rinsing in the wash tank 15, and closes the second water-supply air operated valve 19 to set a large distilled water flow rate.

In other words, during wafer processing with a large quantity of air bubbles, the pull-up of the wafer 2 from the chemical tank 1 is set to a high speed so that a large amount of chemical flows into the wash tank 15. Consequently, the water supply to the wash tank 15 is increased to perform high efficiency rinsing within a short time within the wash tank 15.

During high speed pull-up, the wafer 2 is conveyed with a thick coating of chemical on the surface. The air-borne particles at this time attach to the wafer 2 while floating in the fluid film containing the air bubbles. The particles are therefore not directly adhering to the silicon surface so that when washing is performed while in this state, the fluid film on the wafer 2 and the particles are both washed away. As a final result, few particles directly adhere to the wafer 2 but a large quantity of water must be supplied to the wash tank 15.

The fluid level inside cylinder 7 on the other hand, does not fall much, and when the chemical processing is finished, or in other words, when the non-contact fluid level sensor 6 has detected that the fluid setting level 23 is between the reference fluid level 22 and the level of the opening 21, the sensor 6 determines that few air bubbles 4 are present in the wafer processing and sets a low pull-up speed for the wafer 2 by issuing a first control signal after the chemical processing. Simultaneous with that setting, a second control signal is issued from the sensor 6 to close the first water-supply air operated valve 18 and open the second water-supply air operated valve 19 during rinsing in the wash tank 15.

A low pull-up speed from the chemical tank 1 is set when few air bubbles 4 are present during wafer processing. Due to the effect of tensile force during pull-up, the chemical 5 is pulled into the chemical tank 1 from the surface of the wafer 2. As a result, the amount of chemical remaining on the wafer 2 is small, so that the amount of chemical flowing into the wash tank 15 is also small and rinsing just as effective as the rinsing during high speed pull-up can be performed with a small amount of water.

In this embodiment, by in this way determining with the non-contact fluid level sensor 6 if there is a large or a small amount of air bubbles 4 during wafer processing, a high speed or a low speed can be automatically set as the pull-up speed from the chemical tank 1, the flow rate or in other words a large or a small flow rate can also be automatically set during rinsing in the next wash tank 15, and the amount of distilled water used in the wash tank can be reduced.

Figure 4:
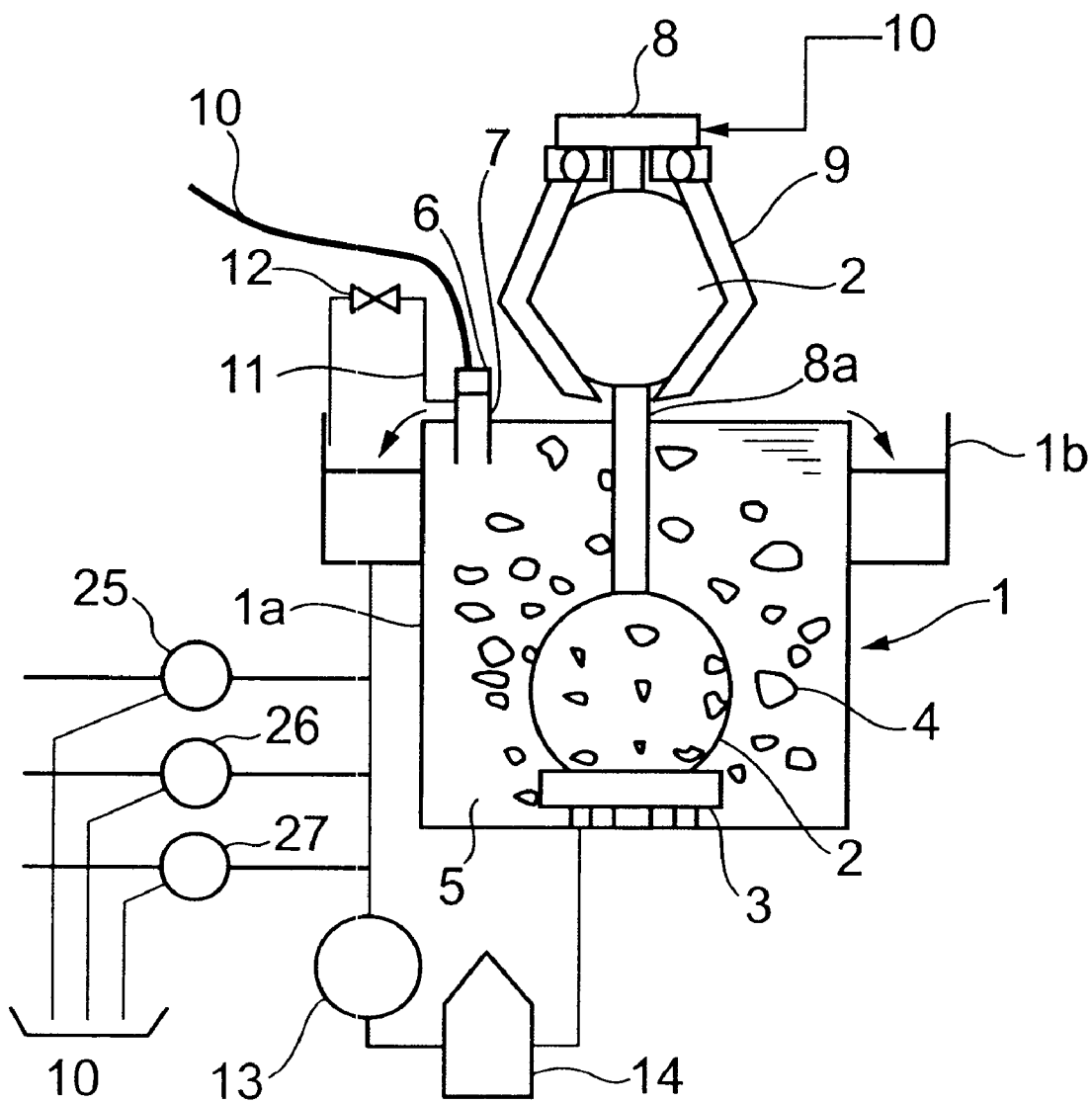
FIG. 4 is a drawing showing a cross sectional view of the wet processing device of the second embodiment of the invention.
Figure 5A:
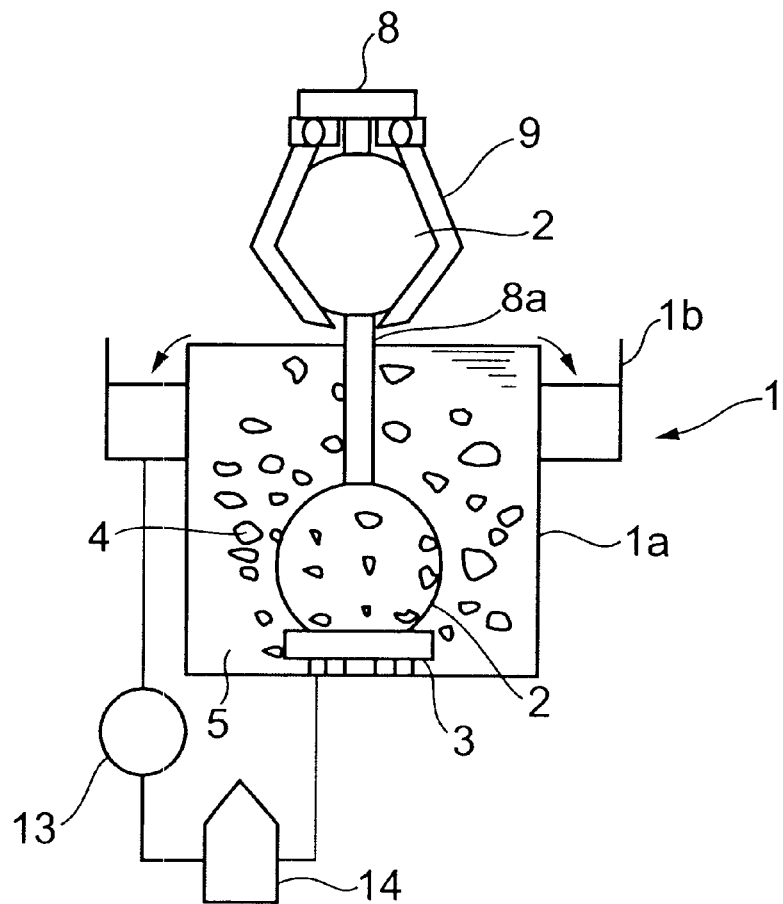
FIG. 5A and FIG. 5B are respectively drawings showing cross sectional views of the wet processing device of the prior art.
Figure 5B:
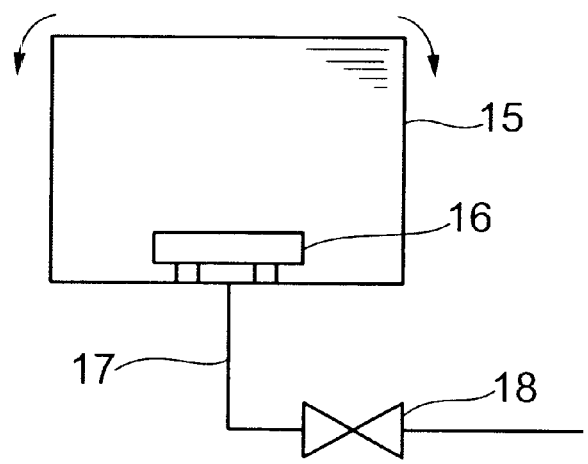

A cross sectional view of the wet processing device for describing the second embodiment of the invention is shown in FIG. 4. The chemical processing section of this embodiment, as shown in FIG. 4, is formed with a chemical tank 1 and a wafer conveyor and wash tank (omitted here since is identical to FIG. 1B), utilizes the non-contact fluid level sensor 6 to detect the quantity of air bubbles 4, and also controls the concentration of hydrogen peroxide and wafer pickup speed as well as the amount of distilled water. Members assigned with the same reference numerals are identical to the members in FIG. 1A so an explanation is omitted here.

In this embodiment, the circulation filtering line having a circulating pump 13 and a filter 14 for the inner tank 1a of chemical tank 1, also consists of a distilled water fill pump 25, a hydrogen peroxide pump 26, and a sulfuric acid pump 27, and controls the concentration of chemicals being supplied. The non-contact fluid level sensor 6 installed in the cylinder 7 determines the air bubble 4 condition (amount of air bubbles 4 are detected by sensor 6), supplies a third control signal and when many air bubbles 4 are present, and along with stopping the filling of hydrogen peroxide from the hydrogen peroxide pump 26, also drives the distilled water fill pump 25 and the hydrogen peroxide pump 26 to lower the concentration of hydrogen peroxide and decrease the air bubbles 4 in the inner tank 1a inside the chemical tank 1.

This embodiment differs from the first embodiment in the point that the concentration of the chemical 5 is adjusted according to the amount of air bubbles 4 in the inner tank 1a of chemical tank 1. Further, the pull-up of the wafer 2 and the washing after pull-up of the wafer 2 are processed in the same way as previously described in the wash tank 15 in FIG. 1B.

Further, the supply of chemical for refilling was explained above as being controlled with the hydrogen peroxide pump 26 however, all the pumps 25 through 27 may also be controlled so that the relative amount of hydrogen peroxide is reduced.

By controlling the chemicals in this way, the adherence of particles to the wafer due to the effect of the air bubbles can be limited, and consequently uniform wafer quality achieved, and product reliability improved to an even higher level.

The wet processing device of this invention as described above, detects the status of the air bubbles within the chemical tank so that a high pull-up speed or a low pull-up speed to pull up wafer from inside the chemical tank can be automatically set to render the effect that the amount of distilled water consumed inside the chemical tank is minimized and that a reduction in particles can be achieved.

This invention renders the further effect that the amount of water supplied to the wash tank is controlled according to the air bubble status within the chemical tank, and the amount of distilled water consumed inside the wash tank can be reduced, to achieve lower costs.

This invention renders the still further effect that by achieving control of the air bubble quantity and water supply quantity, various types of wafers can be handled, uniform wafer quality can be attained, and product reliability improved to an even higher level.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A wet processing device comprising:

a chemical processing tank to store chemicals for processing the surface of the wafer, a wafer conveyor to carry said wafer in and out of the interior of said chemical processing tank, sensor means to determine the amount of air bubbles occurring within the chemical when present within said chemical processing tank and issue a first and a second control signal, and a wash tank to store water for washing said wafer carried out from said chemical processing tank by said wafer conveyor, wherein the first control signal issued by the sensor means to control a pull-up speed of said wafer conveyor device pulling said wafer up from said chemical processing tank, wherein the second control signal issued by the sensor means to control an amount of water supplied to said wash tank, and wherein said sensor means comprises a non-contact fluid level sensor installed by sealing material on an upper part of a cylinder having an opening in the bottom, a reference fluid level to match the overflow level of said chemical tank is formed in said cylinder, and air bubbles in said chemical flow into a sealed space within said cylinder, and the amount of air bubbles is detected by the height of the fluid level.

2. A wet processing device according to claim 1, wherein said sensor means comprises an air bleed pipe containing valves connected at a position on the side surface of said cylinder, between a bottom surface of said non-contact fluid level sensor and said reference fluid level of said cylinder.

3. A wet processing device according to claim 2, wherein said sensor means includes at least one fluid setting level to determine the amount of said air bubbles between said reference fluid level of said cylinder and said opening, and when the sealed space reaches that fluid setting level, the amount of air bubbles is determined to be large.

* * * * *